(12) United States Patent
Cathelin et al.

(10) Patent No.: US 8,154,307 B2
(45) Date of Patent: Apr. 10, 2012

(54) ELECTRONIC CIRCUIT COMPRISING A DEVICE TO MEASURE PHASE NOISE OF AN OSCILLATING AND/OR RESONANT DEVICE

(75) Inventors: Andrea Cathelin, Laval (FR); Sylvain Godet, Launaget (FR); Olivier Llopis, Toulouse (FR); Éric Tournier, Toulouse (FR); Stephane Thuries, Castanet-Tolosan (FR)

(73) Assignees: STMicroelectronics S.A., Montrouge (FR); Centre National de la Recherche Scientifique, Paris (FR)

( * ) Notice: Subject to any disclaimer, the term of this patent is extended or adjusted under 35 U.S.C. 154(b) by 769 days.

(21) Appl. No.: 12/233,421

(22) Filed: Sep. 18, 2008

(65) Prior Publication Data

US 2009/0079441 A1    Mar. 26, 2009

(30) Foreign Application Priority Data

Sep. 20, 2007   (FR) ..................................... 07 57729

(51) Int. Cl.
*G01R 29/26*    (2006.01)
*G01R 23/20*    (2006.01)

(52) U.S. Cl. ....................................... 324/613; 324/622

(58) Field of Classification Search .................. 324/613, 324/622
See application file for complete search history.

(56) References Cited

U.S. PATENT DOCUMENTS

| | | | | |
|---|---|---|---|---|
| 4,118,665 A * | 10/1978 | Reinhardt | ...................... | 324/613 |
| 5,036,299 A * | 7/1991 | Dick et al. | ...................... | 331/25 |
| 5,053,714 A * | 10/1991 | Durand | ......................... | 324/613 |
| 5,608,360 A * | 3/1997 | Driscoll | ..................... | 331/107 A |
| 6,944,121 B1 * | 9/2005 | Weste et al. | ................... | 370/208 |
| 6,944,432 B2 * | 9/2005 | Pohjonen | ...................... | 455/260 |
| 7,030,704 B2 * | 4/2006 | White | .............................. | 331/3 |
| 7,809,517 B1 * | 10/2010 | Zuckerman | ................... | 324/537 |
| 2004/0000921 A1 | 1/2004 | Mordkovich | | |

OTHER PUBLICATIONS

Preliminary French Search Report, FR 07 57729, dated Apr. 30, 2008.

\* cited by examiner

*Primary Examiner* — Timothy J Dole
(74) *Attorney, Agent, or Firm* — Gardere Wynne Sewell LLP (57) ABSTRACT

An electronic circuit includes several (at least two) oscillating and/or resonant devices. The circuit uses a measuring device to measure the phase noise of one of the two oscillating/resonant devices. This measuring device is integrated on a chip on which the oscillating/resonant device to be measured is also integrated. The circuits and methods described find application in the area of radiofrequency/high frequency electronics RF/HF, in particular adapted to general public applications in mobile communication systems and/or to metrology.

27 Claims, 7 Drawing Sheets

ELECTRONIC CIRCUIT COMPRISING A DEVICE TO MEASURE PHASE NOISE OF AN OSCILLATING AND/OR RESONANT DEVICE

PRIORITY CLAIM

This application is a translation of and claims priority from French Application for Patent No. 07 57729 of the same title filed Sep. 20, 2007, the disclosure of which is hereby incorporated by reference.

BACKGROUND OF THE INVENTION

1. Technical Field of the Invention

The present invention generally concerns electronic circuits in the area of radiofrequency/high frequency RF/HF electronics, in particular those adapted to applications for the public at large in a mobile communications system and/or to metrology applications. More precisely, the invention concerns noise measurement in these electronic circuits, in particular the phase noise of at least one oscillating and/or resonant device included in one of the circuits and whose oscillation and/or resonance frequency remains to be determined.

2. Description of Related Art

At the present time, the development of communications systems leads to developments in the electronic circuits used entailing a certain number of requirements, in particular in terms of integration, cost and reliability. The major difficulty regarding these requirements lies in the predicted behavior of these types of electronic circuits, notably when confronted with the increase in frequencies used which renders testing means even more complex.

This behavior concerns a first set of characteristics of these circuit types in relation to a second set of characteristics. The first set comprises the lifetime of the electronic circuit, its capability for faster frequencies, its accuracy, its versatility and more generally its various performance levels. The second set of characteristics comprises the stresses undergone by this type of circuit generally due to ambient temperature, external vibrations, electromagnetic surroundings of these circuits and hence the disturbances generated by this environment.

For the modeling of this behavior one particular measuring technique is usually used. It consists firstly of producing circuit prototypes, then of conducting a series of measurements of these prototypes to extract their performance curves. Then, in relation to these measurement results, the second step is to adjust various parameters of the circuits in order to draw close to desired performance levels. The preceding steps are repeated until an electronic circuit is finally obtained which offers the desired optimal performance. It is therefore necessary to measure the characteristics of the electronic circuit as regularly as possible to determine initial performance levels, and to monitor their development within an application.

One of the most important measurements in an electronic circuit, of interest to designers, is the measurement of its different noises, allowing translation of the influence exerted by the different stresses, and hence prediction of how the circuit will perform.

In a circuit comprising at least one oscillating and/or resonant device, particular attention is paid to measurement of a particular type of noise of the oscillating and/or resonant device: phase noise. This phase noise is effectively a limiting factor for a frequency increase and/or bit rate increase in mobile communications systems. By measurement of phase noise of an oscillating device it is meant phase or frequency fluctuations around the central frequency of this device. By measurement of residual phase noise in a resonant device it is meant the phase fluctuations of a signal passing through the resonant device between its input and its output.

The measurement of this phase noise signal, and indeed the measurement of any other parameter, can only be carried out if, right from the design stage of the electronic circuit, additional connection lines are provided so that it is possible to access directly the circuit element to be measured, so that it can be connected to an outside measuring instrument via a conventional measuring system. With the high frequencies of mobile communication systems, these additional connection lines are comparable to transmission lines which may insert dispersions in the measured signal. Said dispersions are also present in the main functioning of the electronic circuit, even if the measurement is inactive. Additionally said measuring system with all its component instruments is very voluminous and of high cost.

There is a need to overcome these disadvantages by proposing a considerable decrease in the size of the additional connection line of the electronic circuit, by reducing the size of the phase noise measuring device and positioning it as close as possible to the circuit.

SUMMARY OF THE INVENTION

An electronic circuit comprises a first oscillating and/or resonant device able to produce a first signal at a first oscillation and/or resonance frequency representing the phase noise of said first device; a second oscillating and/or resonant device able to produce a second signal at a second frequency representing the phase noise of said second device, one of these two signals being used as reference measurement. The electronic circuit also includes a device to measure the phase noise of one of the two oscillating and/or resonant devices to be measured, said device being integrated on a chip on which said device to be measured is also integrated.

The purpose is to integrate the measuring device entirely within the electronic circuit so as to allow a single designing of the whole circuit. This has the advantage of simplifying the use of measurement devices by reducing their number and hence their cost and volume compared with conventional external measuring systems. Also, by means of this arrangement, it is possible to obtain phase noise measurements that are regular and automated. It is also possible to reduce considerably the time dedicated to measurement, and to minimize interferences added by the external measuring system.

According to a first embodiment, the measuring device of the invention notably includes an input path receiving said first signal, an output path delivering an output signal; a power splitter circuit to split said first signal into two identical signals; parallel first and second measuring pathways whose respective inputs are connected to the power splitter circuit, and whose respective outputs are connected to a mixer circuit, the first measuring pathway being connected to the second oscillating and/or resonant device and delivering the second signal to the mixer circuit, the second measuring pathway comprising a phase-shift circuit and delivering a fifth signal to the mixer circuit that is phase shifted relative to said second signal, and a low-noise amplifier arranged before the output path.

The measuring device may also include filtering means connected to the amplifier.

According to a second embodiment, the second measuring pathway of the device comprises a third oscillating and/or resonant device.

According to a third embodiment, the measuring device comprises an additional measuring pathway intended to replace said first measuring pathway, this additional measuring pathway comprising a fourth oscillating and/or resonant device.

Preferably, the electronic circuit comprises switching means between the first and the additional measuring pathways.

Additionally, the electronic circuit may comprise a digital cell notably including a digital signal processor DSP able to receive digital data from an analog/digital converter ADC, and to deliver digital data to a digital/analog converter DAC.

Also, the digital processor comprises mans to store the measured phase noise value, means to compare this value of the measured phase noise with a reference phase noise value, and decisional means to determine the behavior or phase noise development of the oscillating and/or resonant devices.

According to a first example, at least one oscillating and/or resonant device is an oscillator with adjustable frequency.

For example, the adjustable frequency oscillator comprises a bulk acoustic wave resonator BAW.

According to a second example, the first oscillating and/or resonant device is a frequency synthesizer or a local oscillator LO or a voltage-controlled oscillator.

According to one specific application, the digital processor, the analog/digital converter, the digital/analog converter and the oscillating and/or resonant devices are usual components of a radiofrequency transmit-receive chain.

Advantageously, the measuring device is able to characterize the phase noise of the oscillating and/or resonant devices during non-communicating time intervals of said chain, using the elements which are already present in this chain and which are usually non-utilized during these non-communicating intervals.

The bulk acoustic wave resonator BAW is fabricated on an acoustic-absorbent carrier, itself fabricated either by stacking materials having different acoustic impedances on a substrate of the circuit, or on a membrane below which the substrate is etched.

Also, the BAW resonator can be directly integrated on the circuit chip, or can be fabricated on a different chip then integrated with the circuit chip using connection means.

In an embodiment, a phase error measurement circuit comprises: an oscillator generating an oscillation signal at an oscillation frequency; a splitter circuit to split said oscillation signal into first and second identical signals, the first identical signal applied to a first processing path and the second identical signal applied to a second processing path; a resonant circuit having a resonant frequency substantially equal to the oscillation frequency coupled in series within the first processing path; a phase shift circuit coupled in series within the second processing path; a mixer having a first input connected to an output of the first processing path and a second input connected to an output of the second processing path, the mixer having an output; and a low-pass filter coupled to the output of the mixer and generating an output signal.

That generated output signal is indicative of a phase noise of one of either the oscillator or the resonant circuit.

BRIEF DESCRIPTION OF THE DRAWINGS

Other characteristics and advantages will become more clearly apparent on reading the following description given by way of illustrative example and non-limiting, given with reference to the appended drawings in which.

DETAILED DESCRIPTION OF THE DRAWINGS

The circuits and methods are described below under a specific application which is a circuit including a radiofrequency transmit/receive chain and for which phase noise characterization is of importance.

In radiofrequency transmit/receive chains, the spectral purity of the oscillating and/or resonant devices is an essential parameter for the quality of links in the chain, since their noise is superimposed over the useful signal during signal transposition of homodyne or heterodyne type in the case of analog signals, and these noises influences the quality of detection of digital signals. On this account, it is necessary to measure the phase noise of these oscillating and/or resonant devices or to determine their spectral density in order to adjust the parameters of the chain in relation to the phase noise of the device. However, the circuits and methods described herein can be used in other applications, as will be seen below.

Figures 1, 2:
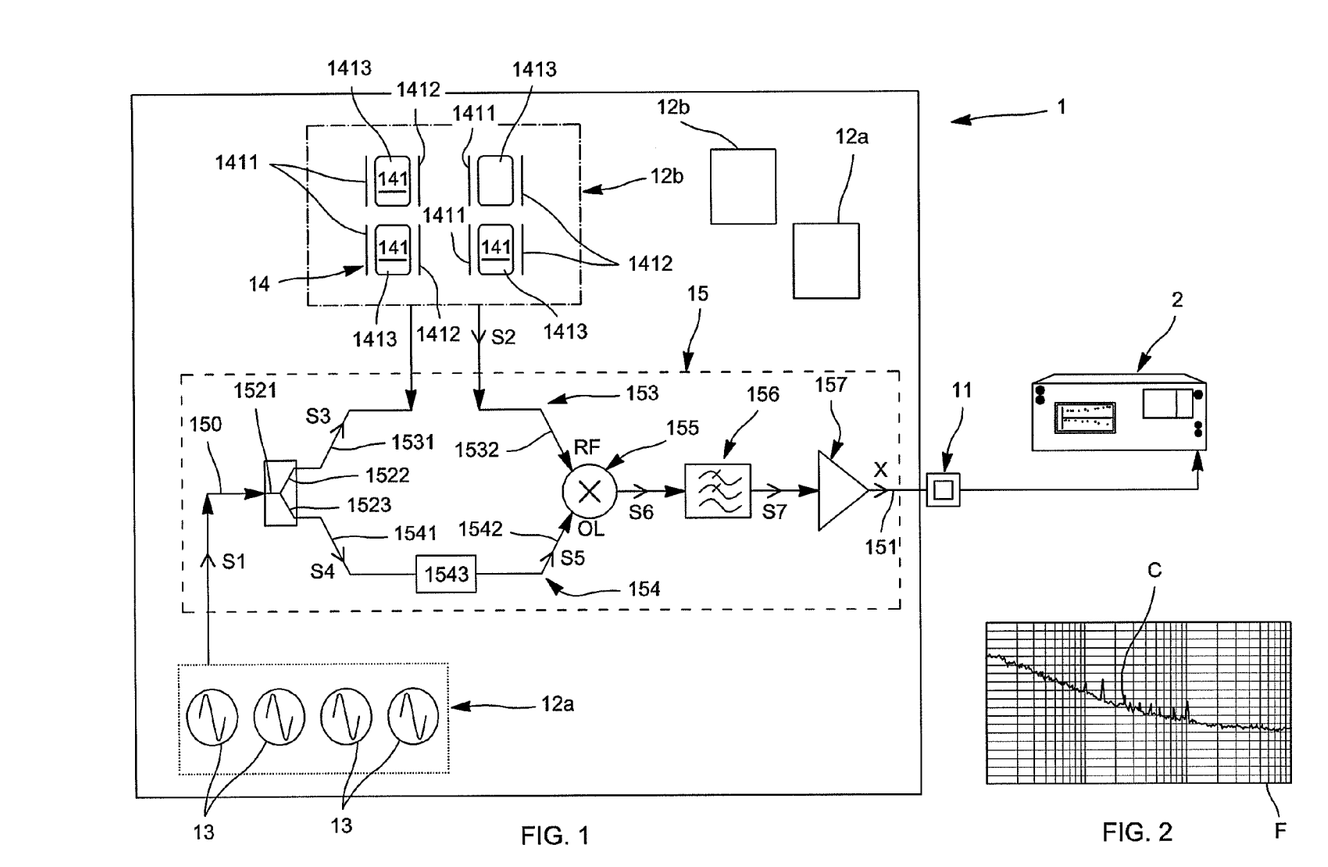
FIG. 1 is a schematic illustration of an electronic circuit particularly comprising oscillating and/or resonant devices and a phase noise measuring device.
FIG. 2 is a graph giving a curve showing the phase noise of an oscillating and/or resonant device of the electronic circuit as a function of frequency in relation to the carrier frequency of the signal.

An electronic circuit 1 is mounted in all its configurations in FIG. 1 and is intended to be integrated into mobile communications equipment of relatively complex architecture in which the monitoring of one or more parameters must be ensured. More particularly, this circuit 1 is intended to be used in any type of so-called RF/HF circuit, i.e. radiofrequency/high frequency, whose noise behavior it is desired to characterize, in particular in terms of phase noise.

The electronic circuit 1 comprises input and output connection ports, of which solely the output port 11 is shown FIG. 1, for its outside connection to an external measuring instrument 2 for example such as a spectrum analyzer. The electronic circuit 1 comprises several components 12a, 12b in which there are oscillating and/or resonant devices 13, 14. These components may be internal or they may be integrated in the electronic circuit 1 itself, or integrated in other adjacent or associated circuits not shown.

In the particular configuration of FIG. 1, a first inner component 12a is provided with at least one first oscillating and/or resonant device 13 producing a first signal S1 at a first oscillation frequency F1. This first oscillating and/or resonant device 13 may be either a stable source with tunable frequency and high spectral purity, for measurement of the resonant circuit 14, or any type of oscillating device 13 whose phase noise is to be measured.

In the first case, and to serve as reference for measurement, the stable source is modeled in manner known per se e.g. by Direct Digital Synthesis DDS, 131. It is to be noted that the Direct Digital frequency Synthesizer DDS 131 is a near-digital block which generates different oscillation frequencies.

Also, in the example shown in FIG. 1, a second component 12b is provided with at least one second oscillating and/or resonant device 14 producing a second signal S2 at a second oscillation frequency F0. This device is represented by a Bulk Acoustic Wave resonator BAW, 141. Signal S2 contains information on the phase noise of this BAW resonator. The BAW resonator 141 is a mechanical resonator functioning with acoustic waves. It uses the properties of the mechanical vibrations of piezoelectric thin layers. As illustrated FIG. 1, the BAW resonator is formed of two metallic electrodes 1411-1412 which excite a piezoelectric film 1413 deposited therebetween and is fabricated directly on a carrier substrate. The acoustic wave is excited in the vertical plane of the piezoelectric layer. This allows a small-size resonator.

To prevent attenuation of the acoustic wave thus generated, the substrate must be conditioned so that it acoustically isolates the resonator, either by the formation of a Bragg reflector, or by fabricating the resonator on a membrane located above a cavity. In the first configuration, an acoustic resonator is used that is based on the stacking of layers on a silicon substrate which have different acoustic properties. Said resonator is known under the name "Surface Mounted Resonator" or SMR. In the second configuration, the resonator is hung on a membrane and is then separated from the substrate by air. It is arranged above a cavity to allow confinement of the acoustic waves in the piezoelectric environment. Said resonator is known under the name "Film Bulk Acoustic Resonator" or FBAR.

In practice, these resonators are easily integrated using CMOS technology and can be implemented on a silicon substrate. This particular aspect enables the BAW resonator to be compatible with integration in or with Very Large Scale Integration technology (VLSI) whose integration density can hold more than 100,000 electronic components on a single chip.

With a FBAR resonator, it is possible, using so-called "above-IC" technology, to integrate this resonator directly on the substrate of the electronic circuit, once the circuit layers have been fabricated, by etching the substrate below a membrane isolating the resonator from the substrate. More particularly, the resonator is fabricated directly above the final passivation layer of the electronic circuit, the electric contacts between the resonator and the remainder of the circuit being produced on the last metal layer of this circuit.

The BAW resonator integration technique of SMR type generally consists of fabricating a first sub-assembly comprising the electronic circuit on a substrate, and a second sub-assembly comprising the resonator on another substrate, and these two sub-assemblies are associated using flip-chip technology and/or known assembly means e.g. bonding or bumping or any other similar technique. The BAW resonator 141 is highly selective and has a relatively high overload factor Q, in the order of 1000. It also has very low phase noise, called residual phase noise, at the oscillation frequency F0. The performance levels of this BAW resonator 141 are better than those of conventional resonators at the same resonance frequency, hence its increasingly more frequent use in present-day radiofrequency circuits.

The electronic circuit 1 comprises a measuring device 15 to measure the phase noise of these oscillating and/or resonant devices 13, 14, that is fully integrated in the circuit 1. This phase noise measuring device 15 comprises an input path 150 to receive the first signal S1 and an output path 151 to deliver an output signal X towards the outside, e.g. towards the spectrum analyzer 2 as can be seen FIG. 1. It also comprises a power splitter circuit 152 in series after the input path 150 comprising an input 1521 and two outputs, one upper 1522 and one lower 1523. This power splitter circuit 152 is able to separate said first signal S1 into a third signal S3 and a fourth signal S4 that are identical, the third signal S3 being intended for the upper output 1522 and the fourth signal S4 for the lower output 1523.

The measuring device 15 also comprises a first 153 and a second 154 measuring pathway connected by their respective inputs 1531, 1541 to the two corresponding outputs 1521, 1522 of the power splitter circuit 152. They are also connected via their respective outputs 1532, 1542 to two paths of a mixer circuit 155, respectively called RF and OL.

According to a first embodiment, the phase noise measuring device 15 comprises a single BAW resonator 141 arranged on the first measuring pathway 153 to receive the third signal S3. In the remainder hereof this phase noise measuring device is called a single-resonator device. This single-resonator measuring device is used to measure the phase noise of the BAW resonator 141. To take into account the dispersions of the resonator around its resonance frequency, a counter-reaction is added to the measuring device as will be described below. Therefore the frequency of the reference device, substantiated here by the direct digital frequency synthesizer (DDS) is "re-positioned" exactly on the resonance frequency so that measurement is accurate.

The second measuring pathway 154 receiving the fourth signal S4 comprises a phase-shift circuit 1543 intended to place the RF path and the LO path of the mixer circuit 155 in quadrature so that the latter functions as phase detector or comparator. More precisely, the RF path receives the second signal S2 output by the BAW resonator 141, corresponding to signal S3 received by the BAW resonator 141 to which is added the residual phase noise of this resonator.

The OL path receives a fifth signal S5, output by the phase-shift circuit 1543, shifted 90° relative to the second signal S2. A sixth signal S6 is delivered by the mixer circuit 155 and consists of a relative component at a frequency F0−F1, and of another relative component at a frequency F0+F1. Yet, as explained further on in the particular example of the specific application of a homodyne chain, the frequencies F0 and F1 are the same. Therefore signal S6 consists of a first baseband component and of a second harmonic component at twice the frequency of signal F0.

Preferably, the mixer circuit 155 is optionally followed by a low-pass filter 156 to eliminate a residue of the high frequency component at 2F0 of the sixth signal S6. Therefore at the output of the low-pass filter there is a seventh signal S7 which corresponds to the baseband component of signal S6 i.e. converted back to around "zero" frequency. A low-noise, high-gain amplifier 157 is connected in series after the low-pass filter 156, which delivers the amplified output signal X to arrive at the measuring instrument 2 with sufficient power to increase measuring accuracy.

Figure 3:
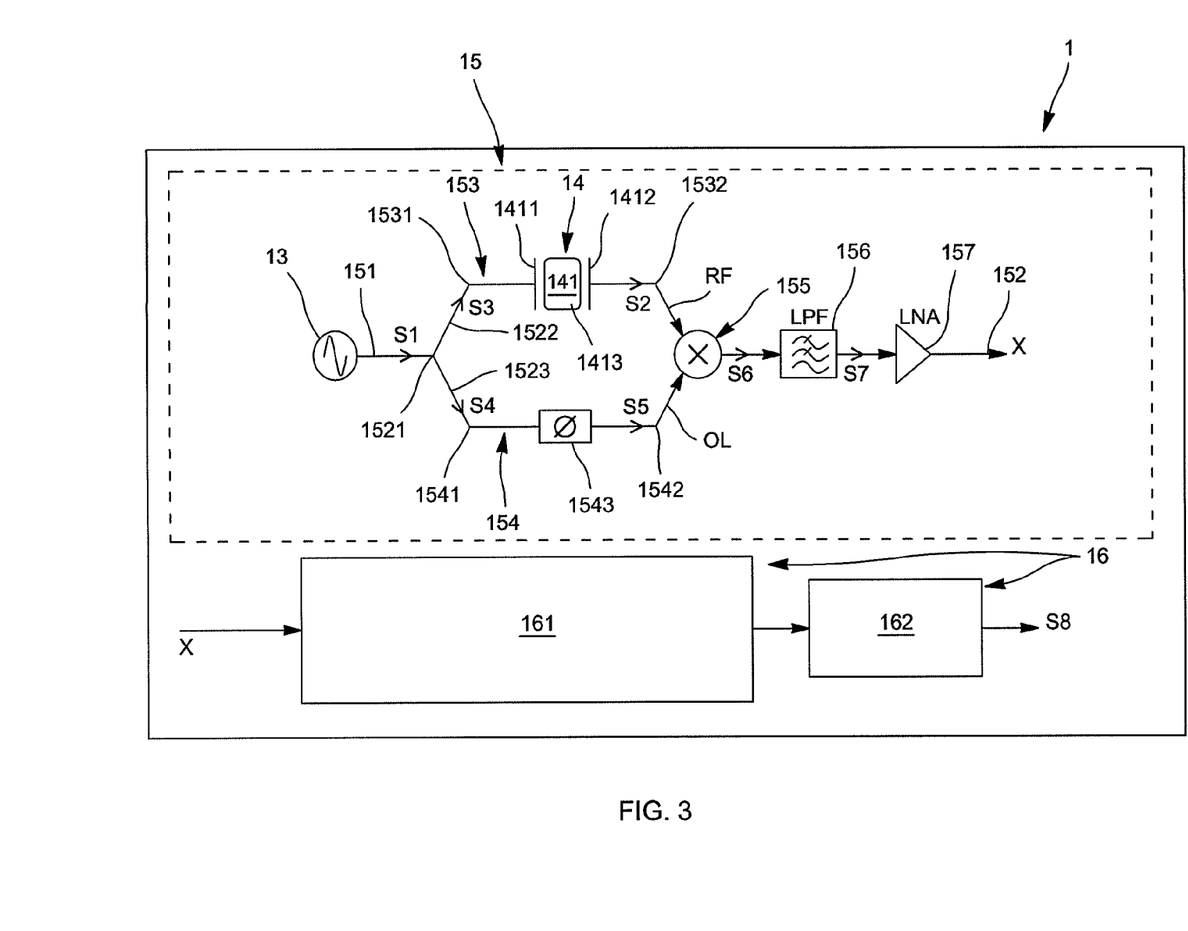
FIG. 3 is an elementary schematic of a first embodiment of the measuring device of the electronic circuit.

FIG. 2 gives a curve C showing the typical response of the output signal X from the measuring device 15 of the invention. Curve C in FIG. 2 corresponds to a typical signal response of a phase noise of the BAW resonator 141 in relation to frequency F compared with the own frequency of the carrier. The phase noise measuring device 15 can be connected in series with a digital cell 16 already existing in the electronic circuit 1 or present on another chip (see, FIG. 3). This cell 16 can consist of conversion means 161 to convert the baseband output signal X into a digital signal S8. It may also comprise digital processing means 162 to process the digital signal S10 obtained. The digital cell 16 may be part of a radiofrequency transmit/receive chain 17 for example as illustrated FIG. 4.

Figure 4:
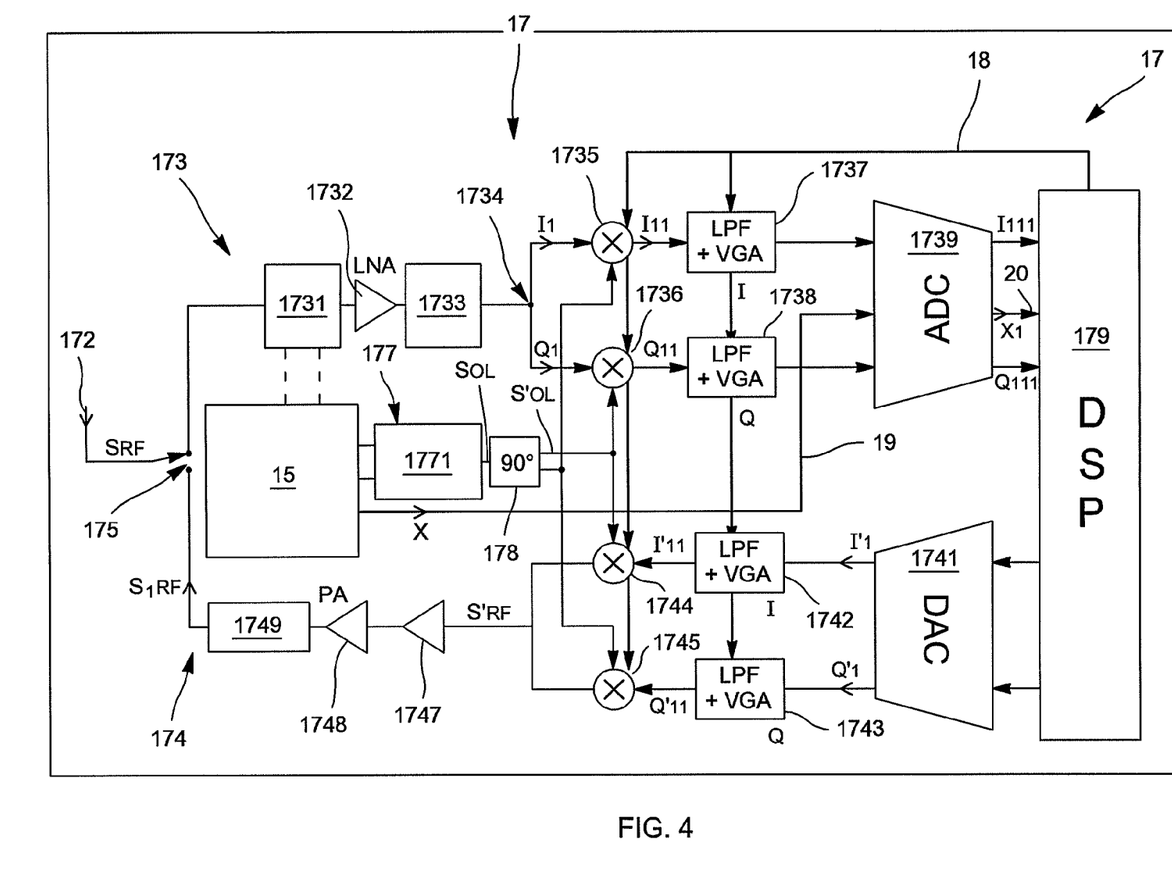
FIG. 4 schematically illustrates the position of the electronic circuit in a specific application concerning a transmit/receive chain.

FIG. 4 schematically illustrates the electronic circuit 1 comprising the measuring device 15 and a radiofrequency transmit/receive chain 17 both integrated on the same circuit. The radiofrequency transmit/receive chain 17 conventionally consists of a first analog part 170 and a second digital part 171 notably comprising the digital cell 16 of FIG. 3. For better integration in the electronic circuit 1, the measuring device 15 of the invention can in principle be fabricated using BiCMOS technology for the analog part 170 of the transmit/receive chain 17, the digital part 171 being fabricated using highly advanced CMOS technology and the BAW resonator 141 being fabricated on a silicon substrate. Said embodiment is not limiting, since the analog 170 and digital 171 parts can both be fabricated using one same technology if the technology so permits.

Preferably, the transmit/receive chain 17 is designed in a manner known per se and has a homodyne architecture, which is a particular case of heterodyne architecture in which the image frequency F1 (representing the difference between frequencies F0 and F1) is zero, and frequency F1 of the local oscillator, here frequency F1 of the DDS source 131, is equal to that of the carrier of the radiofrequency signal which is equal to that of the BAW resonator 141 i.e. F0. As a result, a radiofrequency signal entering into this chain is directly baseband-converted. This chain 17, as is conventional, comprises a transmit/receive antenna 172 to receive and/or transmit the radiofrequency signal SRF, a receiving module or receiver 173 and a transmitting module or transmitter 174. The antenna 172 is connected selectively to the receiver 173 and/or transmitter 174 via a switch 175.

In manner known per se, the chain 17 may include command means, not shown, to command the switch 175 to switch over automatically from the receiver 173 to the transmitter 174 and conversely. The chain 17 also comprises a local oscillator OL 1777 delivering a signal SOL to be mixed with the radiofrequency signal SRF captured by the antenna 172.

In the example shown FIG. 4, a frequency synthesizer 1771 can be mounted as a local oscillator OL 177. The frequency synthesizer 1771 generates a programmable frequency plan with the frequencies contained in a frequency band specified for the application. It may include an oscillator formed by a resonator of BAW type. A phase shifter 178 is also connected in the chain 17 in series with the frequency synthesizer 1771 to deliver, on the output path of this synthesizer, a signal SOL' in which a phase shift of 90° has been added relative to signal SOL.

The chain 17 also comprises a Digital Signal Processor (DSP) 179 to apply digital processing to the different signals present in the chain 17. This DSP processor 179 generally processes digital data for the receiver 173 and transmitter 174. This DSP processor is usually present in any telecommunications system and can be used temporarily, according to the invention, during the time of measurement.

The receiver 173 comprises the following, starting from the antenna 172: a first filter 1731, generally broad band, intended to receive the radiofrequency signal SRF from antenna 172, this filter possibly being a BAW filter; a low-noise, high-gain amplifier LNA 1732, in charge of amplifying the SRF signal; a second, narrow-band, filter 1733 preferably of BAW type, able to select a particular channel within a frequency band of the first filter 1731; an output path 1734 of the filter connected at the same time to components 1735 (identified as I1) and 1736 (identified as Q1) respectively; a first mixer 1735 allowing generation of a baseband signal I11 from component I1 of the SRF signal mixed with the SOL' signal; a second mixer 1736 allowing generation of a baseband signal Q11 from component Q1 of the SRF signal mixed with the SOL signal; two controlled stages 1737, 1738 for signals I11 and Q11 respectively, each stage 1737, 1738 comprising at least one low-pass filter and at least one variable-gain amplifier controlled by a control circuit, not shown, and possibly being contained in the DSP processor 179; and an analog/digital converter ADC 1739 enabling conversion of the two filtered, amplified signals I11 and Q11 into digital signals I111 and Q111 respectively, and sending thereof to the digital signal processor DSP 179.

By analogy with the receiver 173, and starting from the digital signal processor DSP 179, the transmitter 174 comprises: a digital/analog converter 1741 receiving from the DSP processor 179 two signals I14 and Q14 in quadrature, for their conversion into baseband signals I11' and Q11'; two controlled stages 1742, 1743 for each of the signals I114 and Q11' comprising at least one low-pass filter and at least one variable-gain amplifier also controlled by said control circuit in the receiver 173; a third mixer 1744 to mix component I11' with signal SOL; a fourth mixer 1745 to mix component Q11' with signal SOL'. The transmitter 174 also comprises a buffer amplifier 1747 and a power amplifier 1748 to adapt and amplify signal SRF' at the output of the fifth mixer 1746. It also comprises a harmonic filter 1749 to filter the harmonics of signal SRF' outside the RF frequency and to deliver a signal SRF1 to the antenna 172.

The elements briefly described above, whose functioning is not modified under the present invention, will not be described in further detail. Generally, these elements are not activated outside signal transmission, allowing them to be used under the invention for measurement of phase noise of one of the oscillating and/or resonant devices.

The transmit/receive chain 17 described previously cooperates with the integrated phase noise measuring device 15 firstly to provide phase noise measurements of the oscillating and/or resonant devices 13, 14 automatically and regularly present in the chain 17, and secondly to aid decision in the transmit/receive chain. For this purpose, the electronic circuit 1 comprises connection means 18 such as connection wires shown in bold in FIG. 4, to connect the digital signal processor 179 to the controlled stages 1737, 1738 and 1742, 1743 and to connect the processor 179 to said first to fourth mixers 1735, 1736, 1744 and 1745. The circuit also comprises connection means 19 to connect the phase noise measuring device 15 to the analog/digital converter ADC 1739 so that signal X is sent directly from the measuring device 15 to said converter 1739, then connection means 20 to convey this digitized signal X1 to the digital processor 179.

With reference to FIGS. 5 to 8, the electronic circuit 1 is briefly illustrated and comprises the measuring device 15 according to three embodiments, cooperating with the transmit/receive chain 17. It is to be noted that those elements common to FIGS. 5 to 8 carry the same references and will only be described once, solely the differences will be detailed for each figure. It is to be noted also that the third embodiment is a generic mode covering all the possible embodiments of the measuring device 15 of the invention.

In common with FIGS. 5 to 8, the electronic circuit 1 comprises a detection and measuring cell 21 connected to the first RF path of the mixer circuit 155 of the measuring device 15 and to the first oscillating and/or resonant device 13. This detection cell 21 gives warning of a frequency difference ΔF on the DDS source 131 to restore the oscillation frequency F1 of this source back to the frequency F0 of the BAW resonator 141.

Said first measuring pathway 153 also comprises two adaptation means 1533, 1534 connected to either side of the BAW resonator 141 for its adaptation to the power splitter circuit 152 and mixer circuit 155 respectively.

The electronic circuit 1 also comprises a power calibration loop 22 to calibrate input power Pin in relation to the frequency of the resonator F0, to obtain better detection of the useful signal.

The output path of the measuring device 15 is connected to the digital cell 16, namely to the analog/digital converter ADC 1739 generally followed by a low-pass filter 161, then to the digital signal processor 179.

It is to be noted that for digital processing, the digital signal processor 179 comprises a block 1791 using a conventional fast Fourier transform with N points. Also, the DSP processor 179 can send signals towards a system, not shown, which manages the switches illustrated FIGS. 5 to 8 and described below. The processor 179 is also able to manage signals for a decision circuit 1794 and a control circuit for the management of elements 1700 of chain 17. The decision and control circuits will be associated to decide which element is to be controlled subsequent to the result of the collected phase noise measurement.

Next, the output of processor 179 is connected to a parallel/series interface block 162 to convey the signals processed in the processor to these elements 1700.

Figure 5:
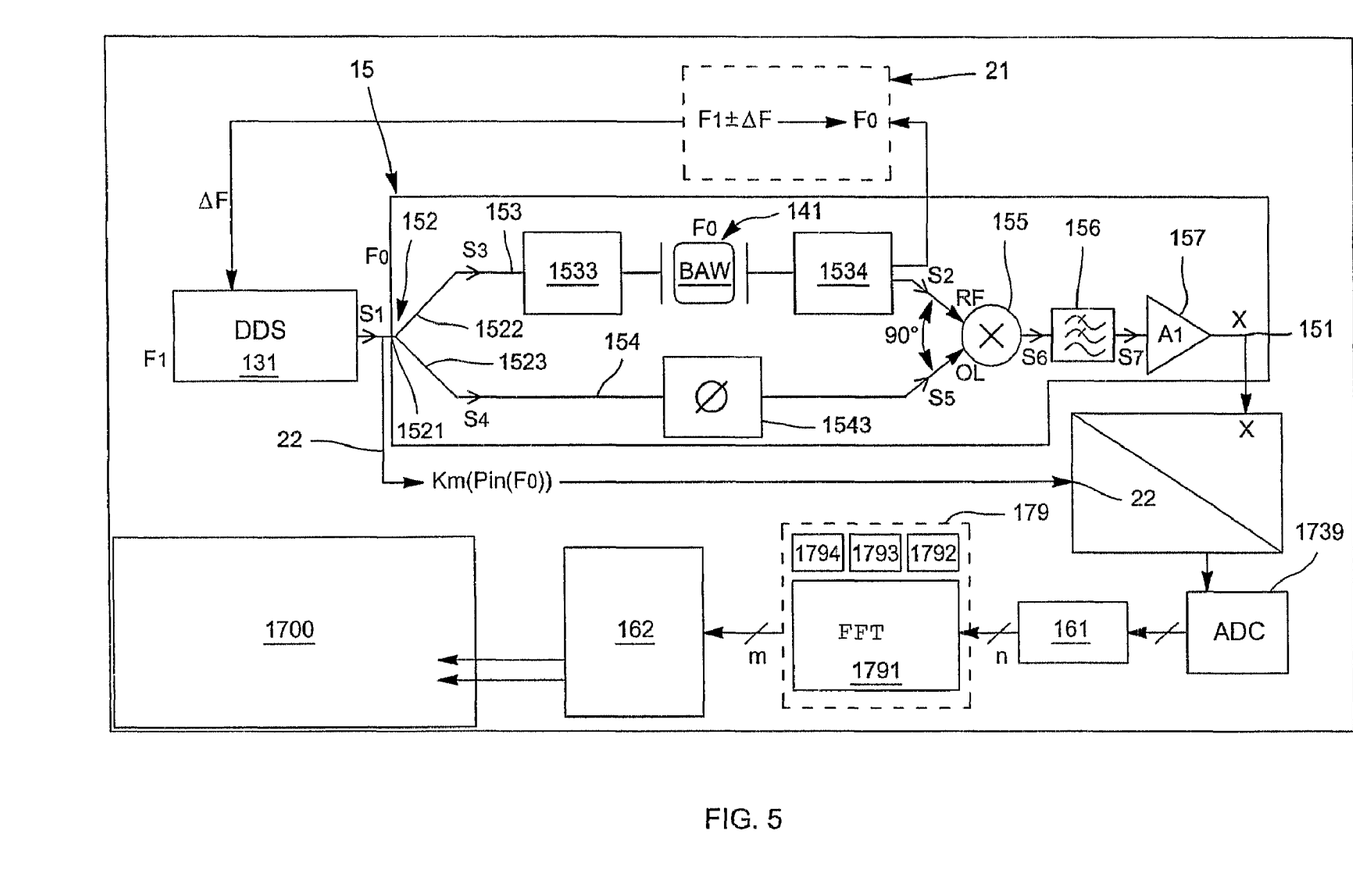
FIG. 5 is a schematic illustration of the first embodiment with a first example of a oscillating and/or resonant device in said specific application.

FIG. 5 illustrates the so-called single-resonator phase noise measuring device 15 according to the first embodiment. This device 15 uses the DDS source 131 as first oscillating and/or resonant device 13 at its input, and the BAW resonator 141 as second oscillating and/or resonant device 14 connected to the first measuring pathway 153. The BAW resonator 141 can derive from the frequency synthesizer 1771 forming a local oscillator in the transmit/receive chain 17.

In this example, the DDS source 131 delivers a reference signal having phase noise around frequency F0, which is much lower than the phase noise of the first resonator BAW 141. The phase noise to be measured is therefore that of the BAW resonator 141. On the contrary, if the phase noise of the DDS source 131 is higher than that of the BAW resonator 141, it is the DDS source 131 which is measured to determine its phase noise. Also, the measuring device 15 only functions as phase noise detector if the frequency F1 of the DDS source 131 is equal to the frequency F0 of the BAW resonator 141.

In practice, solely the fundamental component of the DDS source 131 at frequency F1 is useful and must be equal to the resonance frequency F0, whilst any harmonics of the DDS source are eliminated by the selectivity of the resonator. The example of the DDS source 131 is only one particular case since the DDS source has the particular aspect of having phase noise at resonance frequency F0 which is lower than that of the BAW resonator. Other sources having the particular aspect of good spectral purity around frequency F0 can be considered.

Figure 6:
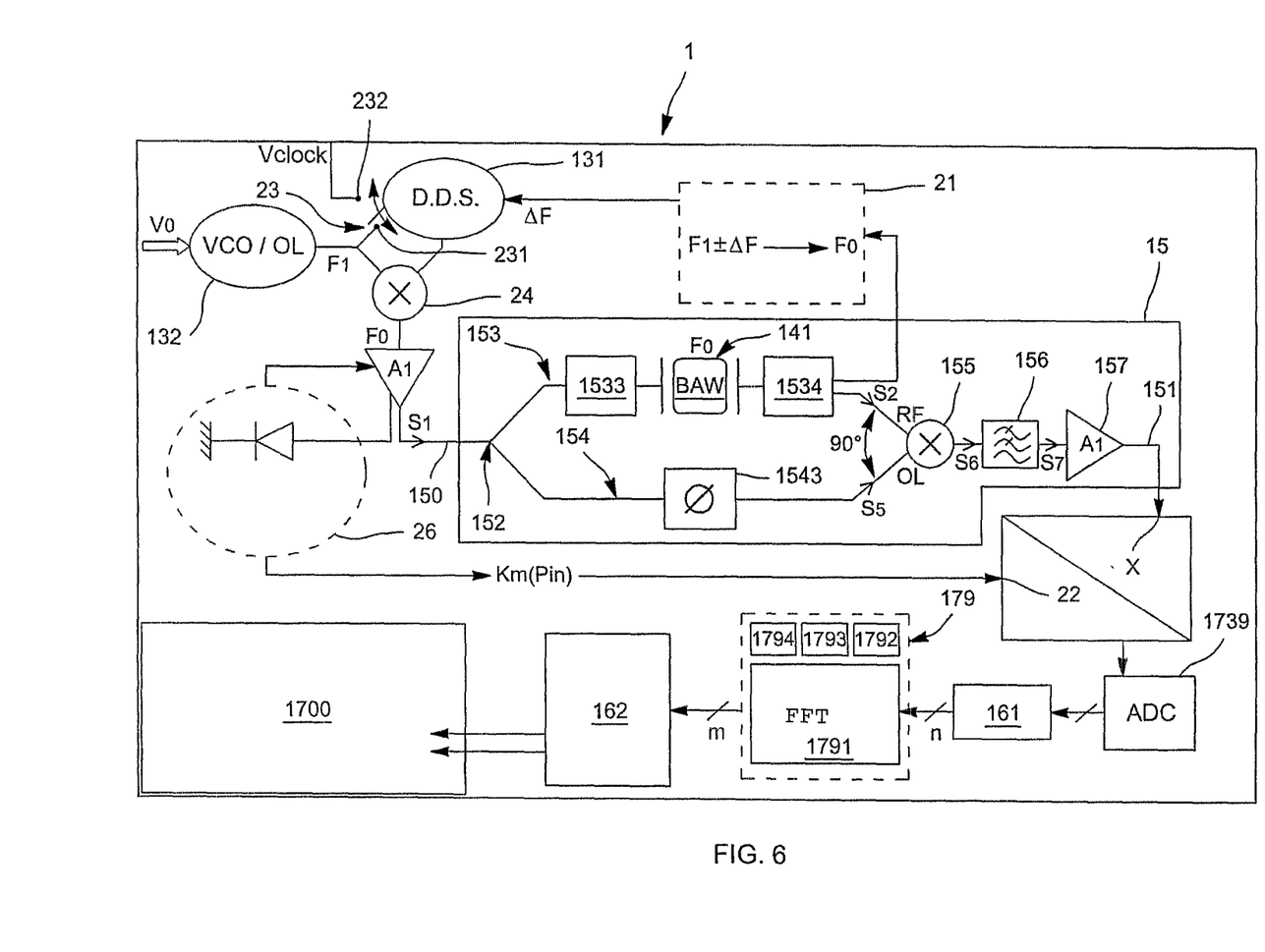
FIG. 6 is a schematic illustration of the first embodiment with a second example of an oscillating and/or resonant device in said specific application.

FIG. 6 depicts the electronic circuit 1 of the invention comprising a first oscillating and/or resonant device 13 represented by a local oscillator OL 132. This local oscillator 132 has an oscillation frequency F1, and its phase noise corresponds to the phase noise to be measured, since it is known that the high quality coefficient of the BAW resonator 141 allows measurement of the phase noise of a local oscillator at F0, which itself generally has a lower quality factor.

In this electronic circuit 1, the local oscillator OL 132 is connected to a DDS source 131 oscillating at frequency ΔF via a first terminal of a switch 23 and via a mixer 24. The switch 23 is able to switch from its second terminal 231 to its second terminal 232 which is connected to a source delivering a clock signal Vclock.

The DDS source 131 is also connected to said mixer. Said mixer 24 is capable of recovering the signal of the local oscillator OL 132 at frequency F1 and the signal from the DDS source 131 at frequency ΔF, to deliver the first signal S1 to the input of the measuring device 15 positioned on the resonance frequency F0 of the BAW resonator 141 of the first measuring pathway 153.

A gain amplifier A1 25, preferably a low-noise amplifier is provided at the input of the measuring device 15 to increase the amplitude of signal S1 at frequency F0 derived from the mixer 24.

A calibration cell 26 to calibrate the input power of signal S1 is provided at the output of the amplifier 25 to calibrate the gain of signal S1 injected into the measuring device 15 in relation to frequency F0.

Also, the first oscillating and/or resonant device 13 may comprise a voltage controlled oscillator VCO instead of the local oscillator OL. The above description remains valid when replacing the local oscillator OL by a VCO oscillator.

Figure 7:
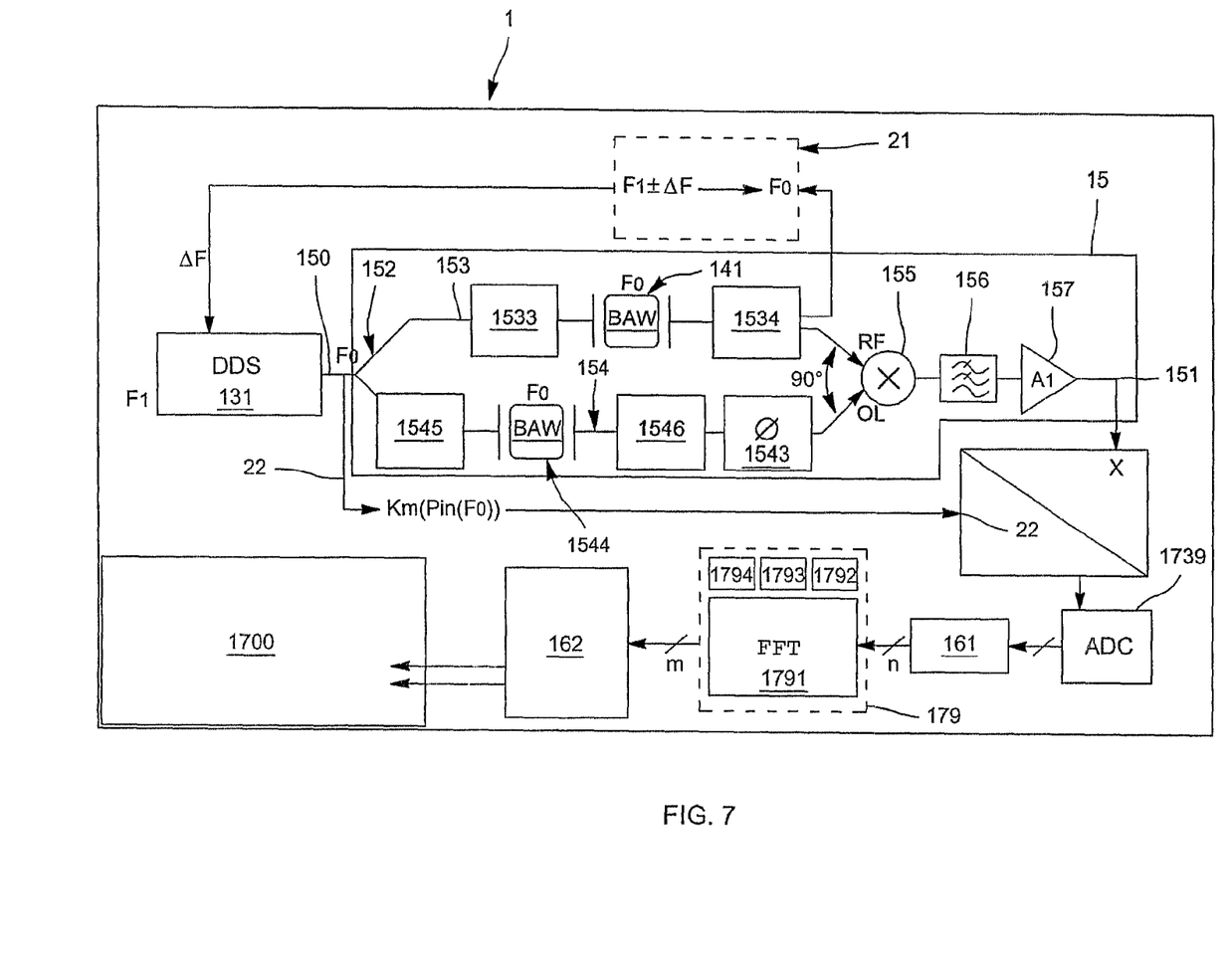
FIG. 7 is a schematic illustration of a second embodiment of the measuring device in said specific application.

FIG. 7 illustrates an electronic circuit 1 with a measuring device 15 according to a second embodiment. The first oscillating and/or resonant device 13 is formed by the DDS source 131, the second oscillating and/or resonant device 14 is formed by the BAW resonator 141. According to this second embodiment, the second measuring pathway 154 is connected to a second BAW resonator 1544 connected to the two adaptation circuits 1545, 1546 in series with the phase-shifter circuit 1543.

Since the first measuring pathway 153 still comprises the first BAW resonator 141, this device is subsequently called a dual-BAW resonator device. The measuring device of the invention is therefore reconfigurable since it is possible to switch from a single-resonator device to a dual-resonator device by means of the presence of the second BAW resonator 1544 on the second measuring pathway 154. This second BAW resonator 1544 is identical to the first BAW resonator 141 and has the same oscillation frequency F0. This second resonator 1544 is used to assist the DDS source 131 so that the stress on the phase noise of the DDS source 131 is released. In this example, the possibility is included to measure the noise of the first oscillating and/or resonant device, represented by the local oscillator or VCO, in addition to the noise of the resonator 141.

Figure 8:
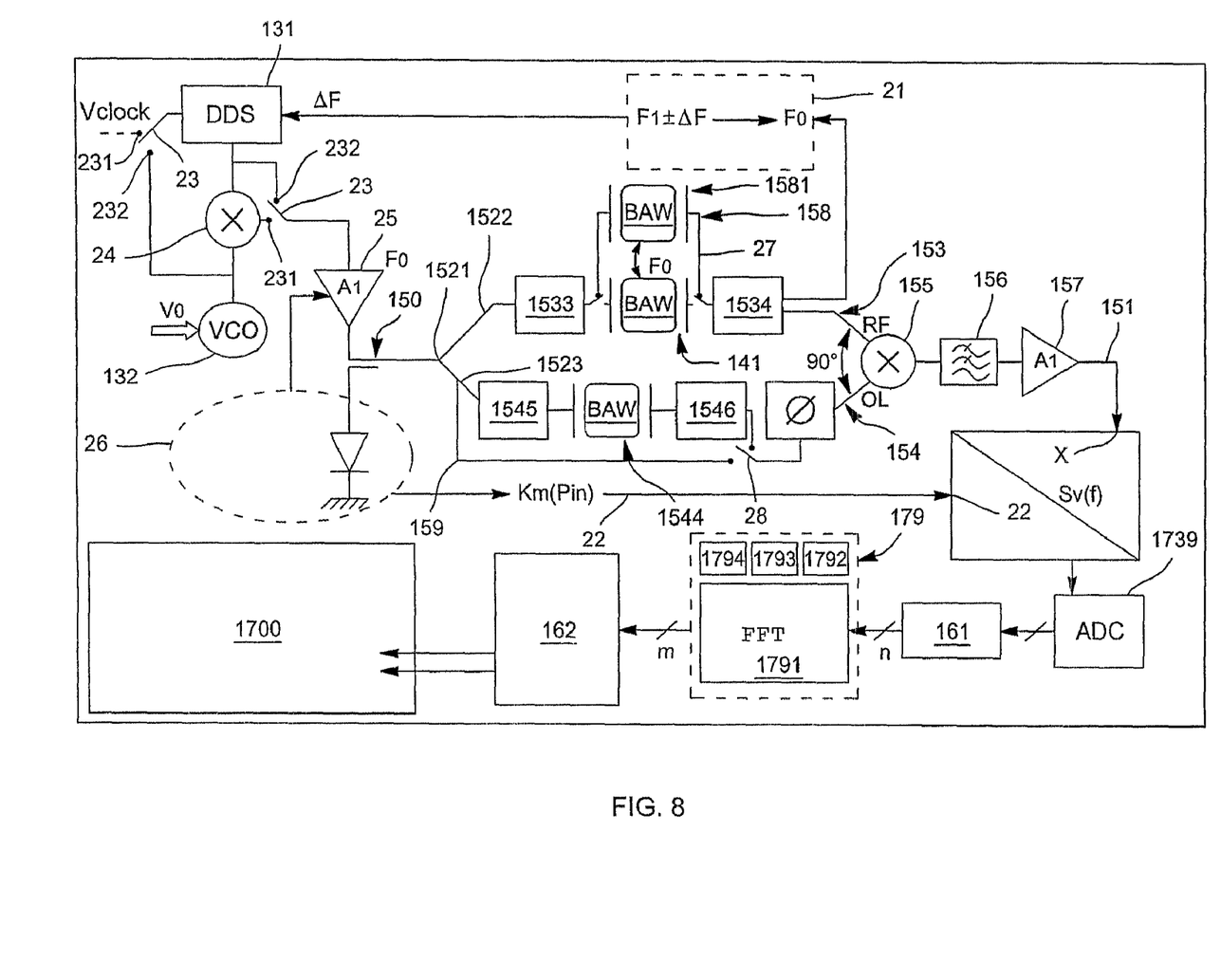
FIG. 8 is a schematic illustration of a third embodiment of the measuring device in said specific application, said embodiment grouping together the two other embodiments.

FIG. 8 illustrates the electronic circuit 1 of the invention with a phase noise measuring device 15 according to a third embodiment. This third embodiment consists of providing the measuring device 15, in addition to its configuration in the two first embodiments, with an additional measuring pathway 158 to replace the first measuring pathway 153 of the first embodiment. This additional pathway 158 comprises a third BAW resonator 1581 multiplexed with the first BAW resonator 141 of the first pathway 153, the adaptation means remaining unchanged. It is therefore possible to measure a whole group of resonators by multiplexing them in this manner. Switching circuits 27 are provided in the electronic circuit to switch from the first resonator 141 of the first pathway 153 to the third resonator 1581 of the additional pathway 158, and to all the multiplexed resonators.

The first oscillating and/or resonant device 13 is the one illustrated FIG. 6. It comprises a local oscillator OL and/or a voltage controlled oscillator VCO 132 cooperating with a DDS source 131, and a detection and measuring cell 21 to convert the signal S1 at the input to the measuring device 15 to the same frequency F0 of the BAW resonators 141, 1581. The BAW resonators 1581 and 141 of the additional pathway 158 are not constantly connected to the measuring device 15 i.e. when no measurement is being made the switch 27 is open so that there is no longer any contact between the BAW resonators 1581 and 141 and the measuring device 15. The BAW resonator 1581 may be an element included in filter 1731 or in filter 1733 of the chain 17, in one variant of this embodiment. Additionally, in this third embodiment, a third measuring pathway 159 in the form of a connection line is provided parallel to the second measuring pathway 154 between the lower output 1523 of the splitter circuit 152 and the phase-shifter circuit 1543.

Switching from the second pathway 154 to the third pathway 159 is obtained by means of a switch 28 which, according to needs, switches the measuring device 15 between a single-resonator device and a dual-resonator device illustrated FIGS. 5 and 6 respectively. On this account, a generic measuring device is obtained, reconfigurable between a single resonator or two resonators.

The functioning of the electronic circuit 1 comprising the measuring device 15 in its specific application connected to the radiofrequency transmit/receive chain 17, is described below. First, in conventional manner, the functioning of the transmit/receive chain 17 is briefly as follows:

During a transmit and/or receive sequence, the SRF signal is captured by the antenna 172, and is then transmitted to the receiver for its subsequent conveying to the analog/digital converter ADC 1739 then to the processor 179 for processing. Once the signal has been processed by the processor 179, it is frequency-converted and conveyed to the antenna 172. During a rest sequence, no signal is transmitted to the receiver 173 and/or to the transmitter 174. The transmit/receive chain 17 cooperates with the measuring device 15 precisely during this rest sequence to optimize the consumption of elements 1700 of chain 17.

At the design stage of one of elements 1700 of chain 17, after its specifications have been given, it is generally characterized under the worst conditions of use, such as deterioration due to ageing of the circuit, or a drift situation in relation to ambient temperature. Next a power consumption of this element is defined which will operate under the laid down specifications. As a result, in most cases, there exists over-consumption of this type of element 1700 which may reach four times the consumption under normal conditions of use. These elements are then said to be over-specified.

To overcome this drawback, it is possible to provide a regular, real-time phase noise measurement of these elements 1700 present in the transmit/receive chain 17, and during the rest time of this chain, so as to characterize their behavior in terms of noise and consumption. In this case, a signal is collected from a source 131 of the chain at a certain frequency F1 (e.g. FM detection). The signal passes through a power splitter 152, it is split into two signals on two pathways OL and RF and is then mixed again to obtain the baseband signal corresponding to the greatest phase noise between the source 131 and the BAW resonator 141. The signal is then digitally converted by an ADC converter and is finally transmitted to the digital processor 179.

In the DSP processor 179, the Fourier transform transforms the signal into a frequency spectrum, then this spectrum is stored in the memory cell 1792 for its comparison by comparison means 1793 with reference measurement values of phase noise signals performed at a time t. During comparison, the decision circuit 1794 determines whether the value of the phase noise of each element 1700 in the chain 17 is equal to the reference value, or whether it is greater or lesser than this reference value.

Finally, a set value is output by the DSP processor 179 towards the elements 1700 of chain 17, consisting in particular of low-pass filters and VGA amplifiers 1737, 1738, 1742, 1743 and the first to fourth mixers 1735, 1736, 1744, 1745, to indicate thereto whether or not their consumption is sufficient and whether their characteristics must be adjusted, by means of a command provided for this purpose, to adapt to the phase noise at time t.

If the result of phase noise measurement appears poor, the system sends a signal to a dialogue box, not shown, which comprises a display unit, not shown, on which it is indicated that the source is faulty. Therefore a user of the invention can see whether the source has aged or whether it is faulty and can take the decision to replace it. This method is similar to a servo-type method.

Finally, elements 1700 of chain 17 are fabricated in their maximum worst case configuration, but will function with exactly the consumption they need by means of this decision. According to the invention, the phase noise measuring device 15 therefore assists management of the consumption of this chain 17 when it is at rest or during a non-communicating time interval.

A non-communicating time interval, or "dead timeslot", is therefore a time interval corresponding to the positioning or start-up time of an element, or re-adjustment of this element, time that is lost on account of the dispersions of the fabricating method of this element or a time of non-transmission. Measurement is regular during "dead timeslots" according to downlink communication standards, from the transmitter (base station) to the receiver and conversely.

Consequently, measurement of phase noise made by the measuring device 15 is processed by elements 1700 of said chain 17, which already exist for transmission and which are re-utilized for the purpose of the invention.

The circuits and method described are not limited to oscillating and/or resonant devices of the transmit/receive chain. It can be applied to any oscillating and/or resonant device usually present in an electronic circuit of any type of architecture for which it is desired to measure phase noise. For example, the invention can be applied to a BAW resonator or to several BAW resonators, in particular in the case of semi-conductor fabrication.

During the so-called EWS test method (Electrical Wafer Sort) which is performed before the final test, all the chips on which the BAW resonators are designed are tested to determine their yield. Generally, it is a first test used to select chips, or chip parts which are faulty.

In the particular case of BAW resonators, these resonators are fabricated with an upper electrode, a lower electrode and a piezoelectric material. They have a relatively high overload factor (greater than 500) at a certain pre-determined resonance frequency F0. To cause BAW resonators to resonate at frequencies different from F0, they are forced to do so by placing a layer of metal above the resonator so that their resonance frequency F0 is down converted to a low frequency F1, these two frequencies F0 and F1 remaining very close however. The difference in frequencies between the BAW resonator at F0 and the BAW resonator at F1 is dependent upon the thickness of the layer placed on the resonator at F1. The result is that two types of resonators at F0 and F1 can co-exist on one same chip. This technique is known under the name "mechanical loading". The phase noise device integrated in the same circuit of the preceding BAW resonators can be an indicator of this frequency.

In this application, to visualize the information, either connection pads are provided on the chips in which the BAW resonators and the phase noise device are integrated to connect the chip to a spectrum analyzer, or a digital processing cell is integrated on the cell, as is the case with the transmit/receive chain, followed by a display unit.

The circuits and methods can also be applied to accelerated ageing tests. To guarantee a certain type of ageing of these elements, the manufacturers subject these elements to accelerated ageing tests, in particular in relation to temperature. For this purpose, the circuits are subjected to very high temperatures for a certain time (e.g. a dozen equivalent hours to a dozen years of oscillator life). When the BAW resonator ages, its phase noise increases. To trace its ageing chart, it is possible to integrate the measuring device and the BAW resonator in the electronic circuit. The phase noise measurements are then performed automatically, in real-time, as and when the ageing test progresses.

The circuits and methods are also applicable to the characterizing of a complete electric model for users of BAW resonators in simulation software for example. To provide an electric model of a BAW resonator for each technology, the phase noise measuring device and the BAW resonator are integrated in the electronic device. Its phase noise is then characterized. This information is added to the electric model of the BAW resonator in the libraries of such software.

Also, instead of characterizing the phase noise of a BAW resonator it is also possible to proceed with characterizing the phase noise of any source. For this purpose the electronic circuit with the measuring device integrated on a chip is connected to the source chip. Characterization can then be carried out.

Finally, the phase noise curve of the source can be displayed on a computer for example or a spectrum analyzer.

In this application it is also possible to provide for a memory unit on the chip, to store measurement results, and a display unit for reading thereof after characterization.

The circuits and methods can also be applied to the design of a synthesizer with very high spectral purity. To do so, the phase noise of a BAW resonator is first measured with the phase noise measuring device of the invention. It is then sought to generate a source having a correlated, reverse, phase noise to the phase noise of the BAW resonator which, by counter-reaction, cancels the phase noise of the source.

Also, another application of this circuit with the measuring device concerns the self-adjustability of communication apparatus with respect to a generic receiver chain, which allows the use of multiple frequency bands such as GSM, WCDMA, FM. By integrating the measuring device and the chain on the electronic circuit, the bandwidths of the filter are adapted in relation to the signal to be received.

The advantage of integrating a measuring device in an electronic circuit is the use of a single measuring device for several hundred BAW resonators.

The circuits and methods effectively provide for phase noise measurements on banks of simple or controlled oscillators, or on resonator banks by multiplexing the elements to be measured, using the possible "reconfigurability" of the technique, for adaptation to each situation by switching from a single-resonator device to a dual-resonator device according to needs.

Also, phase noise measurements are performed without any manual intervention, which means that measurements are automated and hence costs are reduced since a non-integrated device is very costly, and in addition the necessary time for measurement is reduced.

The above description is made with regard to the measurement of the phase noise of a BAW resonator or phase noise of an oscillator such as a voltage controlled oscillator VCO or local oscillator OL. Evidently the invention is not limited to BAW resonators, and all kinds of oscillating and/or resonant devices can be considered.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. An electronic circuit comprising:
a first oscillating and/or resonant device configured to produce a first signal at a first oscillation frequency;
a second oscillating and/or resonant device configured to produce a second signal at a second oscillation frequency, wherein one of the first and second signals is used as a reference measurement; and
a measuring device configured to measure a phase noise of one of the first and second devices, said measuring device being integrated on an integrated circuit chip on which said one of the first and second devices whose phase noise is to be measured is also integrated, wherein the measuring device comprises:
an input path receiving said first signal;
an output path delivering an output signal;
a splitter circuit to split said first signal into two identical signals;
a first measuring pathway and a second measuring pathway in parallel, each pathway having an input connected to receive the identical signal from an output of the splitter circuit, and each pathway having an output connected to an input of a mixer circuit, the first measuring pathway including in series connection the second oscillating and/or resonant device, and the second measuring pathway comprising a phase-shifter circuit such that said output from the second measuring pathway to the mixer circuit is phase-shifted relative to said output from the first measuring pathway to the mixer circuit; and
a low-noise amplifier coupled to an output of the mixer circuit;
wherein the second measuring pathway comprises a third oscillating and/or resonant device in a series connection with the phase-shifter circuit.

2. The circuit according to claim 1, wherein the measuring device also comprises a filtering circuit coupled between the output of the mixer circuit and an input of the low-noise amplifier.

3. The circuit according to claim 1, wherein the measuring device comprises an additional measuring pathway which is switched to replace said first measuring pathway, the additional measuring pathway comprising a series connected fourth oscillating and/or resonant device.

4. The circuit according to claim 3, further comprising switching circuitry between the first measuring pathway and the additional measuring pathway.

5. The circuit according to claim 1, further comprising a digital cell with a digital signal processor DSP which receives digital data from an analog/digital converter ADC and delivers digital data to a digital/analog converter DAC.

6. The circuit according to claim 5, wherein the digital signal processor comprises a data store configured to store measured phase noise, and a comparator configured to compare this measured phase noise with a reference phase noise, and a decision circuit configured to determine the phase noise behavior or development of the oscillating and/or resonant devices.

7. The circuit according to claim 5, wherein the digital processor, the analog/digital converter, the digital/analog converter and the oscillating and/or resonant devices are components of a radiofrequency transmit/receive chain.

8. The circuit according to claim 7, wherein the measuring device is configured to perform measurements of the phase noise of the oscillating and/or resonant devices during non-communicating time intervals of said chain using the elements present in this chain.

9. The circuit according to claim 1, wherein at least one of the oscillating and/or resonant devices is an adjustable frequency oscillator having a relatively high overload factor at its oscillation frequency.

10. The circuit according to claim 9, wherein the adjustable frequency oscillator is a bulk acoustic wave resonator BAW.

11. The circuit according to claim 10, wherein the BAW resonator is fabricated on an acoustic-absorbent carrier, itself fabricated either by stacking of materials having different acoustic impedances on a substrate of the circuit, or on a membrane below which the substrate is etched.

12. The circuit according to claim 10, wherein the BAW resonator is directly integrated on the integrated circuit chip, or said BAW resonator is fabricated on a different chip, then connected to the integrated circuit chip via connection means.

13. The circuit according to claim 1, wherein the first oscillating and/or resonant device is one of a frequency synthesizer or a local oscillator or a voltage-controlled oscillator.

14. A phase error measurement circuit, comprising:
an oscillator configured to generate an oscillation signal at an oscillation frequency;
a splitter circuit configured to split said oscillation signal into first and second identical signals, the first identical signal applied to a first processing path and the second identical signal applied to a second processing path;
a resonant circuit having a resonant frequency substantially equal to the oscillation frequency coupled in series within the first processing path;
a phase shift circuit coupled in series within the second processing path;
a mixer having a first input connected to an output of the first processing path and a second input connected to an output of the second processing path, the mixer having an output;
a low-pass filter coupled to the output of the mixer and configured to generate a signal indicative of a phase noise of the resonant circuit; and
a feedback control loop having an input coupled to receive a signal from the first processing path prior to input to said mixer and an output coupled to the oscillator to tune operation of the oscillator such that the oscillation frequency is substantially equal to the resonant frequency.

15. The phase error measurement circuit of claim 14 further comprising a second resonant circuit having a resonant frequency coupled in series within the second processing path.

16. The phase error measurement circuit of claim 14 further comprising a third resonant circuit having a resonant frequency coupled in parallel with the resonant circuit of the first processing path.

17. The phase error measurement circuit of claim 16 further comprising a switching circuit configured to selectively choose one of the resonant circuit and the third resonant circuit for to be coupled in series within the first processing path.

18. The phase error measurement circuit of claim 14, wherein the resonant circuit is a bulk acoustic wave resonator BAW.

19. A phase error measurement circuit comprising:
an oscillator configured to generate an oscillation signal at an oscillation frequency;
a splitter circuit configured to split said oscillation signal into first and second identical signals, the first identical signal applied to a first processing path and the second identical signal applied to a second processing path;
a resonant circuit having a resonant frequency substantially equal to the oscillation frequency coupled in series within the first processing path;
a phase shift circuit coupled in series within the second processing path;
a mixer having a first input connected to an output of the first processing path and a second input connected to an output of the second processing path, the mixer having an output;
a low-pass filter coupled to the output of the mixer and generating a signal indicative of a phase noise of the resonant circuit;
a second resonant circuit having a resonant frequency coupled in series within the second processing path; and
a switching circuit in the second processing path configured to selectively bypass the second resonant circuit in the second processing path.

20. The phase error measurement circuit of claim 19 further comprising a feedback control loop having an input coupled to receive the first identical signal from the first processing path and an output coupled to the oscillator to tune operation of the oscillator such that the oscillation frequency is substantially equal to the resonant frequency.

21. A phase error measurement circuit, comprising:
an oscillator configured to generate an oscillation signal at an oscillation frequency;
a splitter circuit configured to split said oscillation signal into first and second identical signals, the first identical signal applied to a first processing path and the second identical signal applied to a second processing path;
a resonant circuit having a resonant frequency substantially equal to the oscillation frequency coupled in series within the first processing path;
a phase shift circuit coupled in series within the second processing path;
a mixer having a first input connected to an output of the first processing path and a second input connected to an output of the second processing path, the mixer having an output;
a low-pass filter coupled to the output of the mixer and generating a signal indicative of a phase noise of the oscillator; and
a feedback control loop having an input coupled to receive a signal output from the first processing path prior to said mixer and an output coupled to an input of the oscillator to tune operation of the oscillator such that the oscillation frequency is substantially equal to the resonant frequency.

22. The phase error measurement circuit of claim 21 further comprising a second resonant circuit having a resonant frequency coupled in series within the second processing path.

23. The phase error measurement circuit of claim 21 further comprising a third resonant circuit having a resonant frequency coupled in parallel with the resonant circuit of the first processing path.

24. The phase error measurement circuit of claim 23 further comprising a switching circuit configured to selectively choose one of the resonant circuit and the third resonant circuit for to be coupled in series within the first processing path.

25. The phase error measurement circuit of claim 21, wherein the resonant circuit is a bulk acoustic wave resonator BAW.

26. A phase error measurement circuit comprising:
an oscillator configured to generate an oscillation signal at an oscillation frequency;
a splitter circuit configured to split said oscillation signal into first and second identical signals, the first identical signal applied to a first processing path and the second identical signal applied to a second processing path;
a resonant circuit having a resonant frequency substantially equal to the oscillation frequency coupled in series within the first processing path;
a phase shift circuit coupled in series within the second processing path;
a mixer having a first input connected to an output of the first processing path and a second input connected to an output of the second processing path, the mixer having an output;
a low-pass filter coupled to the output of the mixer and generating a signal indicative of a phase noise of the oscillator;
a second resonant circuit having a resonant frequency coupled in series within the second processing path; and
a switching circuit in the second processing path configured to selectively bypass the second resonant circuit in the second processing path.

27. The phase error measurement circuit of claim 26 further comprising a feedback control loop having an input coupled to the first processing path and an output coupled to the oscillator to tune operation of the oscillator such that the oscillation frequency is substantially equal to the resonant frequency.

* * * * *